United States Patent [19]

Tong et al.

[11] Patent Number: 4,778,776
[45] Date of Patent: Oct. 18, 1988

[54] PASSIVATION WITH A LOW OXYGEN INTERFACE

[75] Inventors: David W. Tong, Scotia; John L. Benjamin, Liverpool; William R. VanDell, North Syracuse, all of N.Y.

[73] Assignee: General Electric Company, Schenectady, N.Y.

[21] Appl. No.: 882,857

[22] Filed: Jul. 7, 1986

Related U.S. Application Data

[63] Continuation of Ser. No. 749,374, Jun. 27, 1985, abandoned.

[51] Int. Cl.⁴ .................. H01L 21/306; B44C 1/22
[52] U.S. Cl. ................................ 437/228; 437/233
[58] Field of Search ................. 148/DIG. 17, 33; 204/192 E; 357/59, 49; 156/646; 437/228, 233

[56] References Cited

U.S. PATENT DOCUMENTS 3,884,788  5/1975  Maciolek et al. ........... 148/DIG. 17
4,361,461  11/1982  Chong ........................ 204/192 E

OTHER PUBLICATIONS

Iosif et al., "Polysilicon Passivation of Semiconductor Devices", *Thin Solid Films*, 75, 2, 125-31, Jan 9, 1981.
Thomas et al., "A.E.S. and X.P.S. Studies of Semi-Insulating Polycrystalline Silicon (S.I.P.O.S.) Layers *J. Electrochem. Soc.*, 128, 10, 1766-70.
Chu et al., "In Situ Etching of Silicon Substrates Prior to Epitaxial Growth", *J. Electrochem. Soc.*, 113, 2, 156-8, 8/66.
Colcloser, Microelectronic Processing and Device Design, John Wiley & Sons, New York, 1980, pp. 44-46.

*Primary Examiner*—Brian E. Hearn
*Assistant Examiner*—Tom Thomas
*Attorney, Agent, or Firm*—Paul R. Webb, II; James C. Davis, Jr.

[57] ABSTRACT

A process for depositing oxygen doped semi-insulating polycrystalline silicon (SIPOS) as a passivation layer over the junction of a semiconductor silicon substrate in which the substrate is subjected to an oxygen removal step immediately prior to the creation of the SIPOS layer to thereby prevent the creation of an oxide layer at the interface between the SIPOS and the substrate.

6 Claims, 2 Drawing Sheets

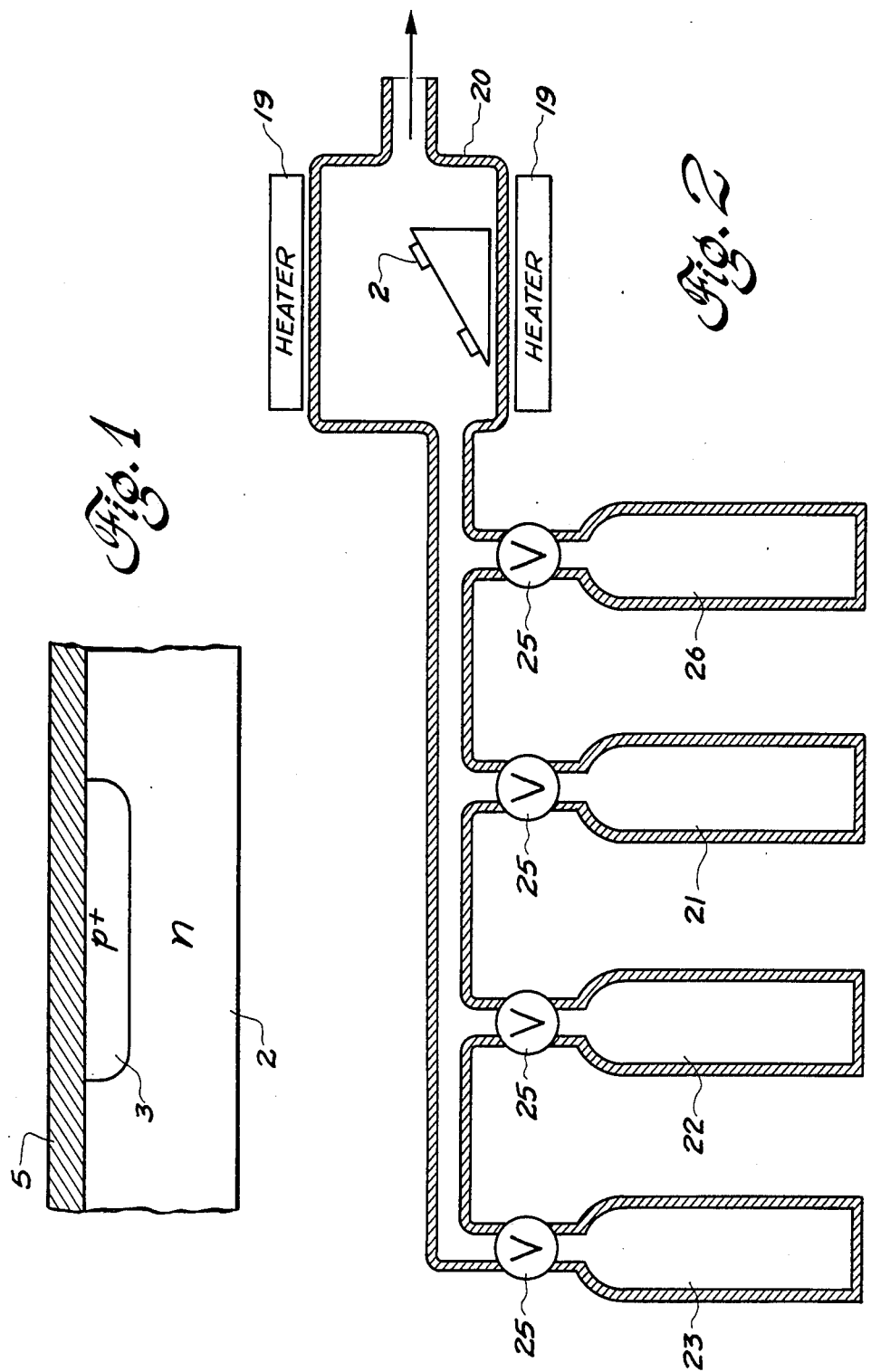

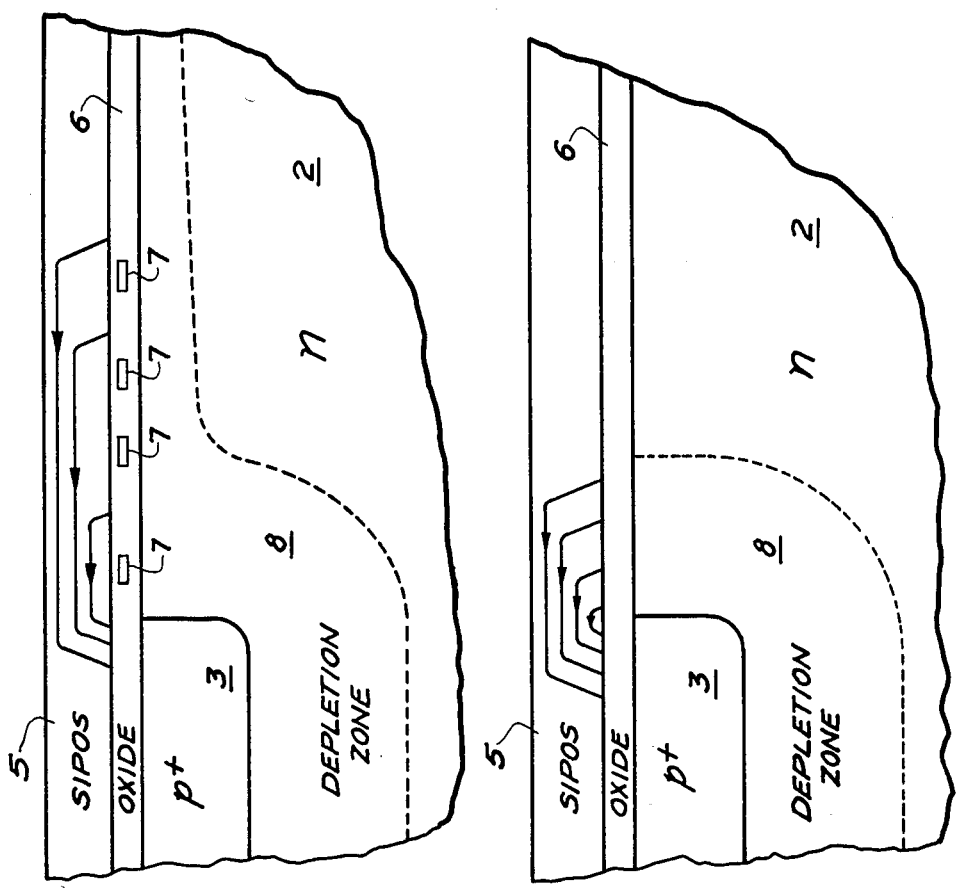

PASSIVATION WITH A LOW OXYGEN INTERFACE

This application is a continuation of application Ser. No. 749,374, filed Jun. 27, 1985, now abandoned.

BACKGROUND OF THE INVENTION

Semi-insulating polycrystalline silicon (SIPOS) is receiving steadily wider acceptance as the alternative to silicon oxide for the passivation of high voltage silicon devices. A major disadvantage of oxide, long the standard passivation used on silicon, is its highly insulating nature which allows the accumulation of net charge. This leads to the eventual drift of device characteristics. SIPOS on the other hand, has a slight conductivity ($10^{-7}$ to $10^{-10}$ ohm-cm) controlled by the degree of oxygen incorporation and hence prevents the appearance of detrimental trapped charges without the introduction of excess leakage current.

U.S. Pat. No. 4,014,037 discloses the use of oxygen doped SIPOS for passivation in semiconductor devices and suitable methods for its deposition. However, it has not previously been noted that the advantages of SIPOS cannot be fully achieved if the interface between the SIPOS and the underlying semiconductor substrate is not under control. In practice, SIPOS is typically deposited by a low pressure chemical vapor deposition (LPCVD) process using $SiH_4$ and $N_2O$ with or without $N_2$ carrier at a temperature of about 625° C. Annealing at about 900° C. for one-half hour results in the appearance of polycrystalline silicon 50 to 100 Angstroms in thickness. Since the permeability of SIPOS to contaminants is quite high, a protective cap of glass, silicon oxide, silicon nitride or other suitable layer is generally used in conjunction with SIPOS.

Using the above noted usual chemical vapor deposition technique for depositing the SIPOS layer, there will inherently be present a layer of "native" oxide approximately 20 Angstroms thick at the interface between the SIPOS and the underlying substrate. This layer is inherently present because of the rapid formation of the oxide when the silicon substrate is exposed to the atmosphere and because no positive steps are taken in the ordinary SIPOS deposition process to remove or insure the absence of such a layer. Such an oxygen-rich interface has indeed been identified by high resolution Auger depth profiling of SIPOS passivated devices constructed in accordance with the standard procedures. The presence of such an oxygen rich layer at the interface between the silicon substrate and SIPOS leads to unexpected interface charges which in turn deteriorate the positive effects of the SIPOS passivation layer and render the operating characteristics of the resultant device at least less predictable, if not erratic.

SUMMARY OF THE INVENTION

A primary object of the invention is therefore to provide a semiconductor device which includes a SIPOS passivation layer and which is constructed in a manner to better insure the inherent operating advantages expected from the SIPOS layer.

A further object of the invention is to provide a semiconductor device of the above noted type which is devoid of an oxygen rich interface between the SIPOS and the silicon substrate to better control the operation of the device.

A still further object of the invention is the provision of a method for forming a SIPOS passivated semiconductor crystal in which an oxygen rich interface of the above noted type is substantially absent.

Yet another object of the invention is to provide a SIPOS passivated semiconductor device which is more predictable and uniform in operating characteristics and less prone to erratic operation due to charges accumulating at the interface between the SIPOS and silicon substrate.

In accordance with an aspect of the invention, a method is provided for forming a SIPOS passivated semiconductor device which includes the step of removing native oxygen from the surface of the silicon substrate immediately prior to the step of depositing the SIPOS layer. Such removal may be accomplished in one of several ways such as by exposing the substrate to a temperature in excess of 1000° C. in the presence of a reducing atmosphere such as $H_2$. Another way of accomplishing the oxygen removal is to use sputtering in an inert atmosphere or plasma etching in a halogen-containing gas. Following either of the above oxygen removal steps the usual CVD process for applying the SIPOS layer is carried out without exposing the substrate to oxygen. During the actual SIPOS deposition process oxygen containing gases are introduced to the substrate to be coated after the silicon-containing gas in order to prevent reoxidation of the substrate surface concurrent with creation of the SIPOS layer.

The foregoing and other objects, features, and advantages of the invention will be apparent from the following more particular descriptions of the preferred embodiments of the invention, as illustrated in the accompanying drawings.

BRIEF DESCRIPTION OF THE DRAWINGS

FIG. 1 is an illustrative cross section view of a semiconductor device constructed in accordance with the prior art.

FIG. 2 is an illustration of a chemical vapor deposition apparatus used in the prior art and modified to carry out the invention.

FIG. 3A is an illustrative showing of electric field distribution in a prior art SIPOS passivated semiconductor device.

FIG. 3B is an illustrative showing of electric field distribution resulting from a SIPOS passivated semiconductor device constructed in accordance with the invention.

DETAILED DESCRIPTION OF THE INVENTION

Semi-insulating polycrystalline silicon is widely used in place of silicon dioxide to passivate high voltage junctions of planar semiconductor devices. A method for making a semiconductor device having such a passivation layer is described in detail in aforementioned U.S. Pat. No. 4,014,037.

By way of brief review, a typical such device using SIPOS passivation is shown in FIG. 1 in which an N-type semiconductor substrate 2 is provided. In accordance with well known techniques, an $SiO_2$ layer (not shown) is initially formed on the substrate 2 by a conventional thermal oxidation or vapor growth method. A suitable opening is then made in the $SiO_2$ layer through which P-type impurities are diffused into the semiconductor substrate 2 to form a P-type semiconductive region 3. Depending on the type of device to be ultimately formed, additional diffused semiconductive regions (not shown) may be formed by repeating the above noted steps. After the diffused areas are formed the bulk of the $SiO_2$ layer (not shown) formed during previous steps as an overlayer on the diffused areas is removed by an etching operation. Polycrystalline silicon and a small quantity of oxygen are then coated on the exposed semiconductor substrate 2 to form the semi-insulating polycrystalline silicon (SIPOS) layer 5 containing oxygen. The SIPOS layer 5 may be formed in accordance with the technique described in aforementioned U.S. Pat. No. 4,014,037 after which an $SiO_2$ layer may be coated on the SIPOS layer, which $SiO_2$ layer is finally selectively etched away to provide an opening into which conductive electrode material is deposited in contact with selected semiconductive regions in order to permit the application of appropriate electrical biases to the device during operation.

According to the prior art, the formation of the SIPOS layer is accomplished by providing a vapor growth container 20, FIG. 2, to which is coupled a source 21 of mono-silane gas $SiH_4$ and a source 22 of dinitrogen mono-oxide $N_2O$. The gases are fed through suitable control valves 25 into the container 20 in which is positioned the substrate 2 whose PN junction is exposed for acceptance of the SIPOS layer. The substrate 2 positioned in container 20 was previously prepared by an etching process to remove the bulk of the $SiO_2$ layer grown thereon, but since no special precautions were taken prior to placement in the container 20 a thin layer of such oxide is inevitably present on the surface of the substrate 2. Indeed, such a layer is present on any silicon substrate exposed to atmospheric oxygen, the thickness of the layer varying in accordance with the time and other conditions of such exposure. A suitable carrier gas, such as $N_2$, provided in tank 23 is also coupled to container 20. The substrate is heated to a temperature between approximately 600° C. to 750° C. and the gases are concurrently fed into the container in a manner specified in the aforementioned patent. The SIPOS layer is created by the thermal decomposition of the mono-silane while oxygen from the $N_2O$ is concurrently and uniformly mixed into the polycrystalline silicon in controllable and well known amounts as a function of the flow rates of the various gases.

A cross section view of a semiconductor device resulting from the prior art process is shown in FIG. 3A with the different component layers labeled with numbers corresponding to those shown in FIG. 1. As alluded to earlier, the major advantage of SIPOS over silicon oxide as a passivation layer is its slight conductivity which should prevent the appearance of trapped bulk charges. However, as shown in FIG. 3A a native silicon oxide layer 6 inevitably is formed at the interface between the SIPOS 5 and the silicon substrate 2. As mentioned above the formation of such an oxide is an inevitable result of exposure of the silicon substrate to the atmosphere prior to the deposition of SIPOS, as is the usual case in the currently used process. Because of the barrier effect due to the silicon oxide, charges 7 accumulate at the interface. The presence of such charges, therefore, removes part of the advantage resulting from the initial use of SIPOS instead of silicon oxide. As a result of such charges when the junction is reverse-biased, the electric field in the silicon depletion zone 8 near the surface is forced to decrease non-linearly from its highest value at the junction to a low value remote from the junction. This non-linear electric field distribution has the effect of lengthening the depletion zone in the region adjacent the interface as shown in FIG. 3A. In some cases this may be a desirable way to increase device breakdown voltage by reducing the maximum surface electric field. However, where field limiting diffusions or related field-control techniques are employed, the results can be unexpected and detrimental to performance. Indeed, on some test transistors it was observed that the field-limiting diffusions are essentially shorted to the base because of the above-mentioned barrier effect. The breakdown voltage of these devices is usually degraded or is unpredictable. In extreme cases, the depletion zone can grow to the edge of a device where surface recombination will produce excessive leakage current. When grading of surface fields is achieved by other means such as field-limiting rings, it is best to completely suppress depletion spread. Since the oxygen-rich interface layer is the origin of the barrier, the removal of this layer before SIPOS deposition is a solution.

As contrasted with the distorted depletion zone 8 of FIG. 3A, the depletion zone 8 of FIG. 3B results from the removal or absence of the native oxide layer from the interface between the SIPOS 5 and the silicon substrate 2. As can be seen from FIG. 3B the absence of interface charges 7 resulting from elimination of the oxide layer 6 produces a linearly decreasing electric field distribution 9 and a more confined depletion zone at the junction interface. The resulting depletion zone and device operation are more predictable.

In order to remove the oxygen rich interface any one of several conventional methods may be employed. One which is compatible with the current CVD SIPOS depositon technique can be appreciated by reference to FIG. 2.

Briefly, prior to exposure of the substrate 2 to the silicon and oxygen containing gases in sources 21 and 22, the container 20 is filled with a reducing atmosphere, such as hydrogen or HCl, from a source 26 (shown in FIG. 2) while the substrate 2 is concurrently heated to a temperature in excess of approximately 1000° C. As a result of this treatment the oxygen containing deposits on the substrate 2 are removed after which the normal steps for the SIPOS deposition may be carried out in accordance with standard procedures without exposing the substrate to oxygen. During such steps it will be beneficial, in order to prevent reformation of the oxide on the substrate 2, to expose the substrate first to the silicon containing gas from source 21 and only then releasing the oxygen containing gas from source 22. With this technique the oxidizing gas does not reform an oxide thereon prior to SIPOS deposition.

Another method for removing the oxygen rich interface layer on the surface of the silicon substrate prior to SIPOS deposition is to use sputtering in an inert atmosphere or plasma etching in a halogen-containing gas. The key to implementing this method is the availability of the proper equipment which can produce and sustain a low pressure discharge, typically at microwave frequencies, next to the substrate wafers. Commercially available equipment designed to perform plasma-assisted chemical vapor deposition can be adapted to carry out this method.

After loading the substrate wafers, a halogen containing gas is made to flow through the chamber at a suitable pressure, say 2 Torr. Examples of such a gas are $SiF_4$, $C_xF_y$ where x and y can take on various combinations of values, and $CF_4+4\%$ $O_2$. The plasma dissociates the etching gas into highly reactive species which is effective in removing the surface oxide on the wafers. After etching, the input gas is replaced by the usual SIPOS-depositing gases and the chamber heated to the proper temperature for SIPOS deposition without exposing the wafers to the atmosphere. The plasma may or may not be utilized during the SIPOS deposition.

A slight variation of this method is to use sputtering where the surrounding gas is inert such as Argon. Again a microwave discharge can be used or a dc discharge with the substrate wafers being the cathode. The discharge creates energetic Argon ions which bombard the wafer surface and remove some of the surface atoms.

Although this invention has been described with respect to preferred embodiments, it is not to be so limited as changes and modifications can be made which are within the full intended scope as defined by the appended claims.

What is claimed is:

1. In a process for fabricating a semiconductor device having an oxygenated polycrystalline passivation layer deposited on a silicon substrate the improvement comprising the steps of:
   removing silicon oxide from the surface of the silicon onto which the polycrystalline layer is deposited; and
   depositing said passivation layer on said substrate under conditions which prevent the reformation of said oxide prior to deposition of said layer.

2. The method of claim 1 wherein the step of removing comprises exposing the substrate to a temperature in excess of 1000° C. in the presence of a reducing atmosphere.

3. The method of claim 1 wherein the step of removing comprises sputtering said substrate in an inert atmosphere.

4. The method recited in claim 1 wherein said step of removing comprises plasma etching said substate in a halogen-containing gas atmosphere.

5. The method of claim 1 wherein said polycrystalline layer is applied by reacting a silicon containing gas and an oxygen containing gas in a reaction zone adjacent said substrate, said oxygen containing gas being introduced into said reaction zone after said silicon containing gas to prevent the oxidation of said substrate surface prior to deposition of said layer.

6. A semiconductor device comprising:
   a silicon crystal substrate; and
   a polycrystalline silicon layer containing oxygen deposited on said substrate, said crystal substrate being devoid of a silicon oxide layer intermediate said substrate and said layer.

* * * * *